United States Patent

Ikeya et al.

[11] Patent Number: 5,807,104
[45] Date of Patent: Sep. 15, 1998

[54] TEST SOCKET FOR DETACHABLE IC CHIP

[75] Inventors: Kiyokazu Ikeya, Shizuoka-ken, Japan; Francois A. Padovani, Westwood, Mass.

[73] Assignee: Texas Instruments Incorporated, Dallas, Tex.

[21] Appl. No.: 592,146

[22] Filed: Jan. 26, 1996

[30] Foreign Application Priority Data

Feb. 8, 1995 [JP] Japan ................................. 7-043423

[51] Int. Cl.[6] .................................................. H01R 9/09
[52] U.S. Cl. ............................ 439/73; 439/912; 324/765
[58] Field of Search .................... 439/70, 72, 73, 439/912, 912.1, 525, 526; 324/158.1, 755, 765

[56] References Cited

U.S. PATENT DOCUMENTS

| | | | |
|---|---|---|---|
| 5,277,594 | 1/1994 | Matsuoka et al. | 439/72 |
| 5,395,255 | 3/1995 | Kato | 439/72 |
| 5,407,361 | 4/1995 | Ikeya | 439/72 |
| 5,460,538 | 10/1995 | Ikeya | 439/73 |
| 5,481,436 | 1/1996 | Werther | 439/70 |

*Primary Examiner*—P. Austin Bradley
*Assistant Examiner*—Barry M-L. Standig
*Attorney, Agent, or Firm*—Russell E. Baumann; Richard L. Donaldson; René E. Grossman

[57] ABSTRACT

A socket with a main socket body 10 for use in a burn-in test of a bare chip 80 with a large number of contact connectors BP is provided with a positioning plate 42 in the top of the socket body 10. This positioning plate has a plurality of through holes 42c with contact members 48 slidingly contained therein. The through holes 42c and contact members 48 are aligned in one to one relationship to contact connections on the bare chip on one side of positioning plate 42 and a plurality of electroconductive film contacts 50 on the other side of the positioning plate 42. The film contacts are movably supported in the socket. Additionally, the film contacts 50 are electrically connected in a one-to-one relationship to socket contact 56 contained in the socket for providing electrical connection between bare chip 80 and socket 10.

14 Claims, 7 Drawing Sheets

TEST SOCKET FOR DETACHABLE IC CHIP

FIELD OF THE INVENTION

This invention relates to a socket; and more particularly, to a burn-in test socket for receipt of an electrical part such as an integrated circuit (IC) in which the electrical part is loaded and unloaded in a freely removable manner in the socket for making electrical contact between the electrical part and socket.

BACKGROUND OF THE INVENTION

As part of the overall quality control process for semiconductor IC chips, the IC chips which are sealed in a package are subjected to final reliability testing. This testing (burn-in testing) consists of functionally testing the chips at elevated temperatures and voltage levels, with only those that pass the test being shipped as satisfactory product.

The construction of a typical prior art socket which is used for IC package loading in a burn-in test is shown in FIGS. 10 and 11. FIG. 10 is an oblique view of the conventional socket, and FIG. 11 is a partial cross-sectional side view of the same socket.

This socket comprises a base 100 as the main socket body to be mounted on a substrate (not shown in the drawings). A cover 102 is provided which can be opened and closed against an upper surface 101 of base 100. A hinge means 104 equipped with a rod 108 and a twisted coil spring 103 is installed on one side of base 100 to provide for the rotational movement of the cover relative to the base about axis rod 108. The movement is indicated by arrow J. A plate piece 106 of hinge means 104 is formed integrally with a first terminal face of cover 102 and has a central bore for receiving rod 108.

A rotary shaft 120 is journaled on a second opposite terminal face of cover 102 with a latch 122 pivotably mounted on shaft 120. At one end of latch 122 is a hook 122a for engaging with a cavity portion 100a provided on base 100 to hold the cover closed on the base when the latch is engaged with the cavity portion. A lever 124 extends integrally from latch 122 and works with a biasing coil spring 126 around shaft 120 to control the movement latch 122 and in turn, hook 122a relative to cavity portion 100a.

Top surface 101 of base 100 is formed in such a fashion that an IC package 130, for example, of the QFP (Quad in line Flat Package) type may be loaded on an IC package loading position 105 at the center of base 100. Also on top surface 101 of base 100, four guide posts 132, 134, 136 and 138 are provided each upstanding in close proximity to one of the four corners of the IC package loading location. Two sides in a pair of guides 132, 136 that face each other on a diagonal line have inclined surfaces with tapered grooves 132a, 136a which expand toward the bottom. The angular part of IC package 130 is guided by these grooves 132a, 136a.

Positioned outside IC loading position 105 toward the periphery of base 100 between the posts 132, 134, 136 and 138, a plurality of contacts 140 are provided corresponding to lead terminals 130a on each side of IC package 130. Between adjacent contacts 140, a partition wall 141 is erected for preventing contacting between contacts as is shown in FIG. 11.

Each contact 140 typically made from a thin sheet of beryllium copper or the like has a fixed part 140a which is fixed in base 100, an arc spring part 140b which extends upward in a curve from the top of fixed part 140a, a straight-line spring part 140c which extends generally horizontally from the top of a spring part 140b, a contact part 140d which extends generally upward at a right angle from the end of straight line spring part 140c and a socket terminal pin 140e which extends vertically downward from the bottom of fixed part 140a, thereby protruding from the bottom of base 100.

In the loading operation, IC package 130 is guided by grooves 132a, 136a and set on IC package loading position 105 with the tip of each lead 130a of IC package placed on contact part 140d of each contact 140. When the cover 102 is closed, a projection-like compressive member 115 in a generally rectangular configuration on the inner surface of the cover engages the tip of leads 130a of IC package 130, thereby downwardly compressing IC package 130 and leads 130a in opposition to the spring force of spring parts 140b and 140c of the contact 140. As a result of this action, the tip of each lead 130a moves vertically downward integrally with each contact part 140d of each contact 140 thereby resulting in electrical connection at a prescribed compressive contact force between the lead and the contact.

In a socket of the prior art, as described above, there is difficulty in physically manufacturing the device when the pitch amongst the leads becomes smaller and smaller as required by new high density IC packages with more leads.

The sockets of the prior art also require that the electrical part processes external lead terminals to make contact with the socket contacts and therefore, will not function with IC chips prior to resin sealing.

Still further, this prior art design can have problems working properly when the burn-in test needs to be at temperatures of about 100 degrees centigrade or higher. This design, even with a vent opening 107 in the lid, can allow for too much heat build-up in the socket thereby damaging the IC chip.

SUMMARY OF THE INVENTION

Accordingly, it is an object of the present invention to provide a socket capable of handling the ever increasing number of pins in electrical parts of narrowing pitch.

It is another object of the present invention to provide a socket which is capable of making electrical connection with an electric part that does not have an external lead terminal.

It is still another object of the present invention to provide a socket which effectively discharges heat that is generated from an electric part that has been loaded into the socket for testing.

It is yet still another object of the present invention to provide a socket which is highly reliable in operation and economical to manufacture.

Briefly described, the socket of this invention comprises a main socket body for receiving an electrical part with a plurality of connective terminals, a positioning plate contained in said main socket body which has an upper placing surface on which said electric part is positioned and placed, said positioning plate having a plurality of through holes corresponding in a one-to-one relationship to the plurality of connective terminals of said electrical part to be placed on said placing surface, an insulating film positioned within said socket body adjacent a lower surface of said positioning plate opposite said upper placing surface, said insulating film having a plurality of electroconductive films contained on a surface of said insulating film with said electroconductive films corresponding in a one-to-one relationship to said plurality of through holes, a first support member movably and elastically supporting said insulating film within said main socket body, a plurality of contact makers which are movably contained in said through holes for providing electrical connection between said plurality of connective terminals and said plurality of electroconductive films, and a plurality of socket contacts contained in said main socket body adapted to be electrically connected to a means external to said socket body which are electrically connected in a one-to-one relationship with said plurality of electroconductive films thereby providing for electrical connection between said electrical part and said means external to said socket body.

In another aspect of this invention, the socket provides for a cover pivotly mounted on the main body of the socket to be freely movably between an open and a closed position relative to the main body and having holding means including a heat sink for securely holding an electrical part in electrical connection in the socket and for carrying heat away from the electrical part during testing of the electrical part.

DESCRIPTION OF THE DRAWINGS

Other objects, advantages and details of the socket of this invention appear in the following detailed description of preferred embodiments of the invention, the detailed description referring to the drawings in which.

DESCRIPTION OF THE PREFERRED EMBODIMENTS

Figure 1:
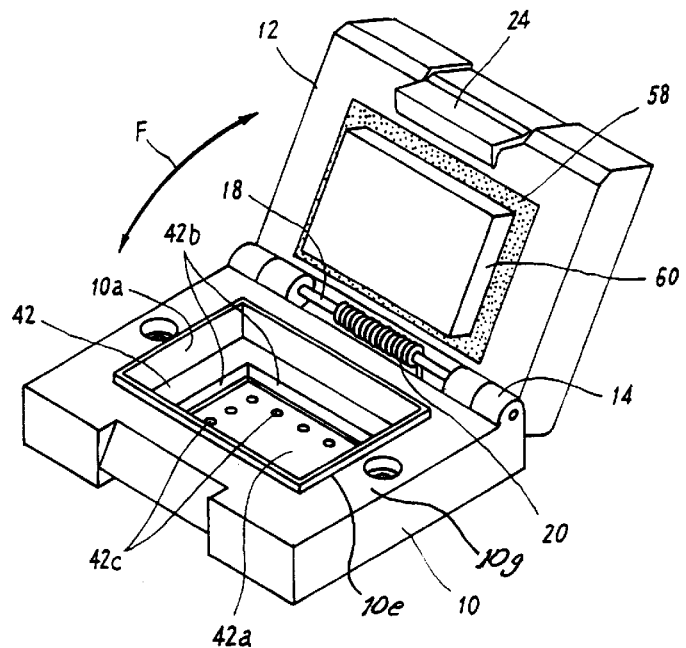
FIG. 1 is an oblique view of a first embodiment of a socket of the present invention.
Figure 2:
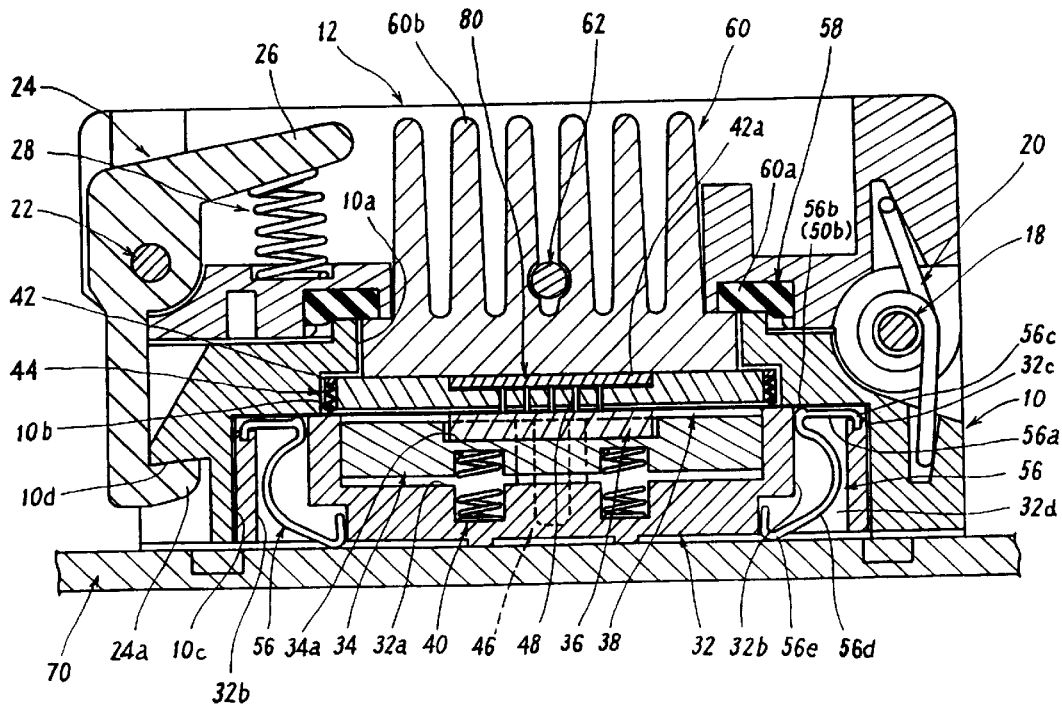
FIG. 2 is a cross-sectional view of the socket of FIG. 1.

A first embodiment of the invention will be explained by referring to FIGS. 1 and 2. FIG. 1 is an oblique view and FIG. 2 is a cross-sectional view of the entire construction of a socket of this embodiment.

The socket comprises an external base 10 as a main socket body that is fixed onto a printed substrate 70. A cover 12 is hinged to base 10 to move in a pivotly, rotational manner between an open and a closed position relative to the upper surface of base 10 as shown in FIG. 1. For this movement, a hinge 14 joins the cover to one end of the base with a rotary shaft 18 as the axis to provide movement indicated by arrow F. A twisted coil spring 20 is positioned around rotary shaft 18 for biasing the cover toward the open position.

A rotary shaft 22 is journaled at a second other end of cover 12 with a latch 24 for holding cover 12 in a closed state on base 10 mounted on rotary shaft 22. A hook 24a is formed at one end of latch 24 which is positioned to engage a step-like cavity 10d that has been formed in a face of base 10 opposite the face containing hinge 14. A lever 26 integrally formed with latch 24 extends in a direction generally perpendicular to latch 24. A compressive coil spring 28 is positioned between the top of cover 12 and lever 26. As lever 26 is moved in a direction in opposition to compressive coil spring 28, the latch 24 is allowed to disengage from cavity 10d of base 10 thereby causing the cover to open.

The external base 10 is formed generally in shape of a rectangular frame. The inner wall surface of base 10 comprises an innermost upper inside wall surface 10a, an intermediate inner wall surface 10b which is one step below this upper inside surface 10a and a lower inner wall surface 10c which is further below intermediate inner wall surface 10b.

In a lower chamber of base 10 that is formed by the lower inner wall surface of base 10, an inner base 32, an intermediate support plate 34, an upper support plate 36 and an insulating film 38 are arranged in that order from the bottom. Inner base 32 typically is made from a resin material and is inserted into and fixed in the lower chamber of base 10. A cavity 32a is formed at the center of the upper surface of inner base 32 and intermediate support plate 34 made of plastic, for example, is contained in this cavity 32a in such a manner as to be capable of vertical motion. Also, a cavity 34a is formed at the center of the upper surface of the intermediate support plate 34 and an upper support plate 36 made of rigid material such as metal, ceramic or the like is arranged in cavity 34a. Insulating film 38 is placed on the upper surface of upper support plate 36.

Positioned between support plate 34 and inner base 32, there are a plurality of compressive coil springs 40 contained in notches in the plate and base 32 respectively which support intermediate support plate 34 in a floating manner in a generally horizontal state as shown in FIG. 2. Insulating film 38 covers the upper surface of upper support plate 36 extending to the outer wall of inner base 32.

Above insulating film 38 there is an intermediate chamber containing a positioning plate 42 made of ceramic, for example. The positioning plate is supported approximately in a horizontal position a suitable distance away from insulating film 38 by means of a plurality of compressive coil springs 44 that have been erected on the upper surface of the inner base 32 through insulating film 38 and arranged along its peripheral surface.

In the upper surface of inner base 32, a plurality of spaced apart positioning pins 46 are provided which extend vertically upward through holes or openings in intermediate support plate 34, upper support plate 36, insulating film 38 and positioning plate 42. Pins 46 position the intermediate plate, the upper support plate, the insulating film and the positioning plate relative to the inner base.

At the center of the upper surface of positioning plate 42, a cavity 42a is provided for positioning and placing an IC chip/bare die to be mounted in this socket. On the upper edge of this cavity 42, a tapered guide surface 42b is formed for guiding the bare chip 80 to a prescribed position inside the cavity 42a.

On the bottom (the die placing surface) of the cavity 42a of positioning plate 42, a plurality of through holes 42c are provided which correspond in a one-to-one relationship to the contact bumps BP (connective terminals) of the bare die chip 80. Into these through holes 42c, a plurality of needle shaped contacts 48 that have been erected on the insulating film are movably inserted in the axial direction to also be in a one-to-one relationship with bumps BP. These needle-shaped contacts 48 are made of an electroconductive rigid material such as tungsten.

When a bare chip 80 is loaded in the cavity or placing surface 42a of positioning plate 42, each bump of bare die 80 will face the tip of each corresponding needle-shaped contact 48 through each corresponding through hole 42c.

Figure 3:
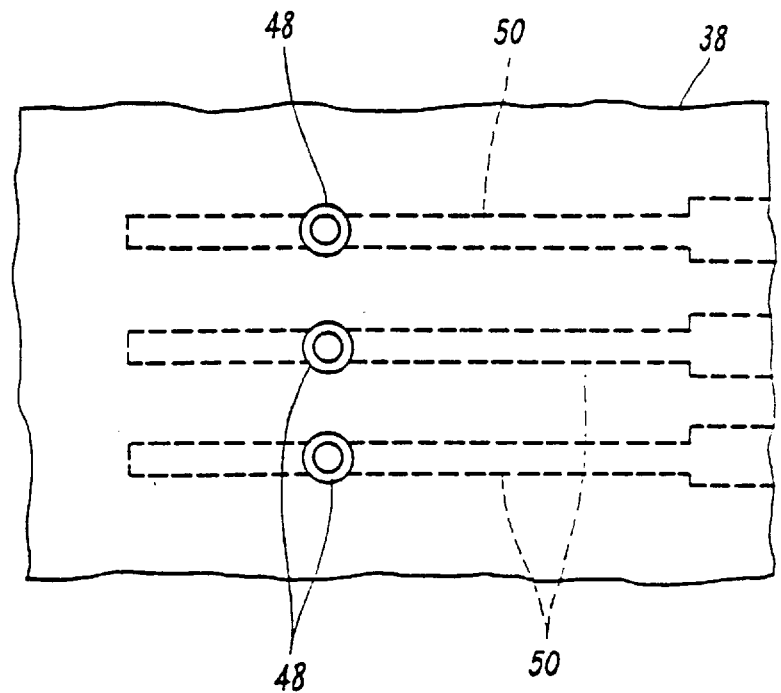
FIG. 3 is a plane view of a wiring pattern on an electroconductive film for use in the socket of FIG. 1.

As shown in FIG. 3, a wiring electroconductive film 50 corresponds to each through hole 42c and each needle-shaped contact 48 is provided in an electroconductive pattern on insulating film 38. These wiring electroconductive films 50 typically are made of copper foil and are formed on insulating film 38 by means of an etching process.

Figure 4:
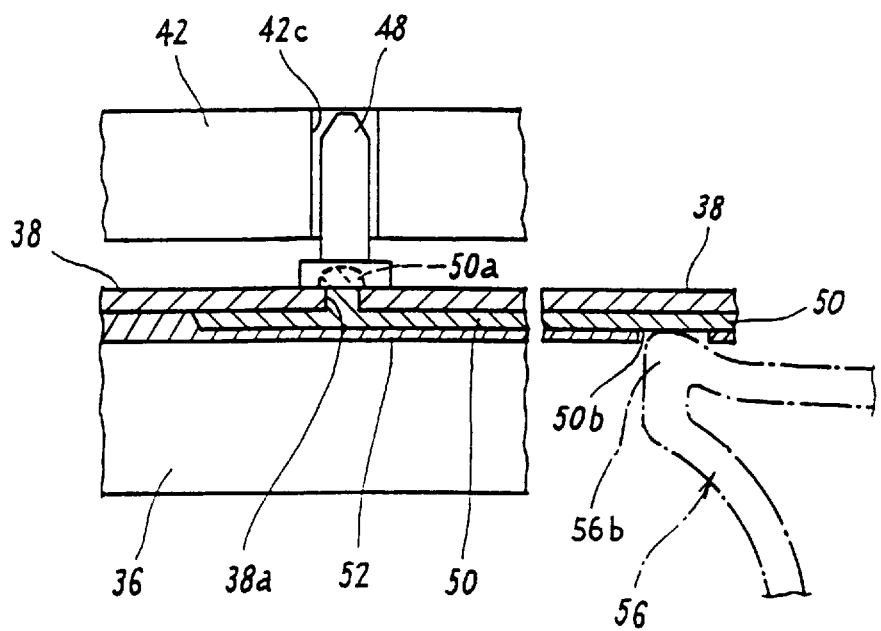
FIG. 4 is a partial cross-sectional view showing the electrical connection in the socket of FIG. 1.

As shown in FIG. 4, each electroconductive film 50 for wiring is covered by an insulating film 52 made, for example, of a polyimide on the reverse side of the insulating film 38 and extends radially from a position adjacent each corresponding through hole 42c toward the periphery of insulating film 38. Additionally, each electroconductive film 50 has a protuberant part 50a that extends through a hole 38a in insulating film 38 to connect to or contact the base of each corresponding needle-shaped contact 48.

In accordance with this invention, each wiring electroconductive film 50 is also exposed as a contact pad 50b exposed from the insulating film 52 at a prescribed location in the neighborhood of the periphery of the layered films and this contact pad 50b is adapted to make contact with an upper contact part 56b of a socket contact 56 (which will be described below).

A plurality of socket contacts 56 arranged at a pitch corresponding to pads 50b of the wiring electroconductive film 50 on the periphery of insulating film 38 are provided in a contact accommodating chamber 32b that is positioned around cavity 32a in inner base 32 as is shown in FIG. 2.

Each socket contact has a horizontal spring part 56a which extends approximately horizontally inward from the peripheral part of the upper surface of inner base 32, an upper contact part 56b that has been formed in such a way as to protrude upward from the inner side of the horizontal spring part 56a, an engaging part 56c which has been formed at the outside edge of the horizontal spring part 56a, an arc spring part 56d which extends downward in a curve from the inner edge toward the outside of the horizontal spring part 56a and a lower contact part 56e that has been formed like a curve at the tip of the arc spring part 56d.

For each socket contact 56, contact part 56b compressively contacts contact pad part 50b of each corresponding wiring electroconductive film 50 by elastic force, and correspondingly the lower contact part 56e compressively contacts each corresponding pad on the printed substrate 70 at all times.

Engaging part 56c is fixed in a groove 32c that has been formed in the periphery of the upper surface of inner base 32, thereby holding each socket contact at a prescribed position. This design provides for stable electrical connection between electroconductive film 50 and socket contact 56. In the contact accommodation chamber 32, there is provided a plurality of partition walls 32d for the prevention of contacting between the adjoining socket contacts 56.

The upper inner wall surface 10a of the outer base 10 is set somewhat higher than the upper peripheral part 10g, thereby forming a frame-shaped ridge 10e. On the inner surface of the cover 12, a dust seal 58 made of silicon foam or the like is provided at a location that corresponds to the said frame-shaped ridge part 10e. When the cover 12 is closed, as is shown in FIG. 2, dust seal 58 securely covers the frame-shaped ridge 10e of base 10, so that the bare chip loading part of the socket is protected from outside dust.

The center of cover 12 is open and a compressive holding pad 60 is installed in such a manner as to cover this opening. This holding pad 60 is made of a heat sink material whose heat conductivity is high such as, for example, aluminum or copper. It comprises a plate holding part 60a possessing a flat inner bottom surface (holding surface) and a large number of heat-discharge fins 60b which have been formed on the opposite side of the bottom surface of holding part 60a. At the center of cover 12, a support axis 62 is provided that supports holding pad 60.

When the cover is closed with a bare chip 80 being loaded in the cavity 42a of positioning plate 42, holding part 60a of holding pad 60 is received in the upper chamber of the outside base, thereby covering the bare chip 80.

The action of the various parts of the socket at the time when a bare chip 80 is loaded on this socket will be explained below by referring to FIGS. 5 and 6.

Figure 5:
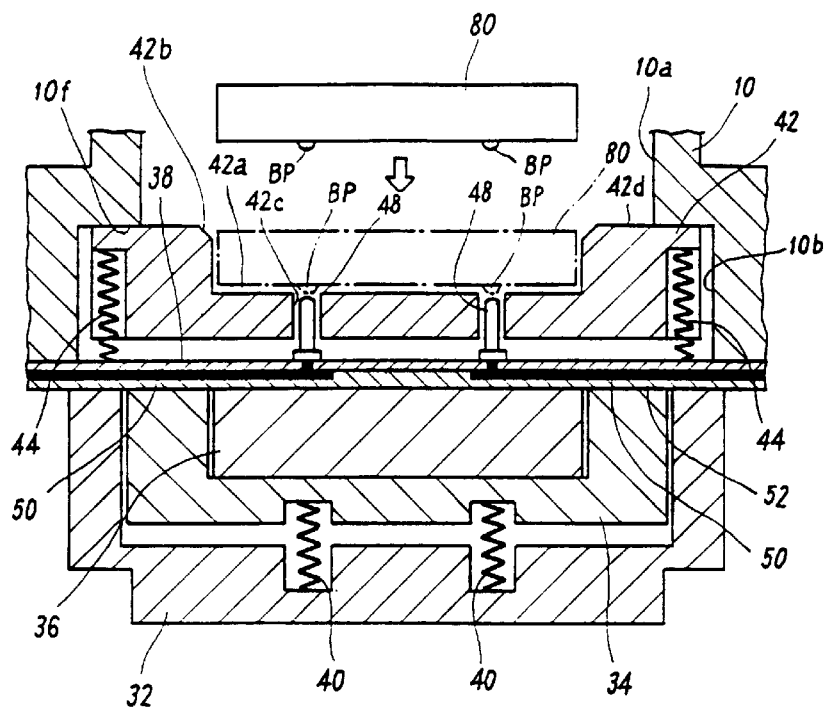
FIG. 5 is a partial cross-sectional view showing the construction of an essential part of the main socket body of FIG. 1 prior to the loading of a bare chip in the socket.
Figure 6:
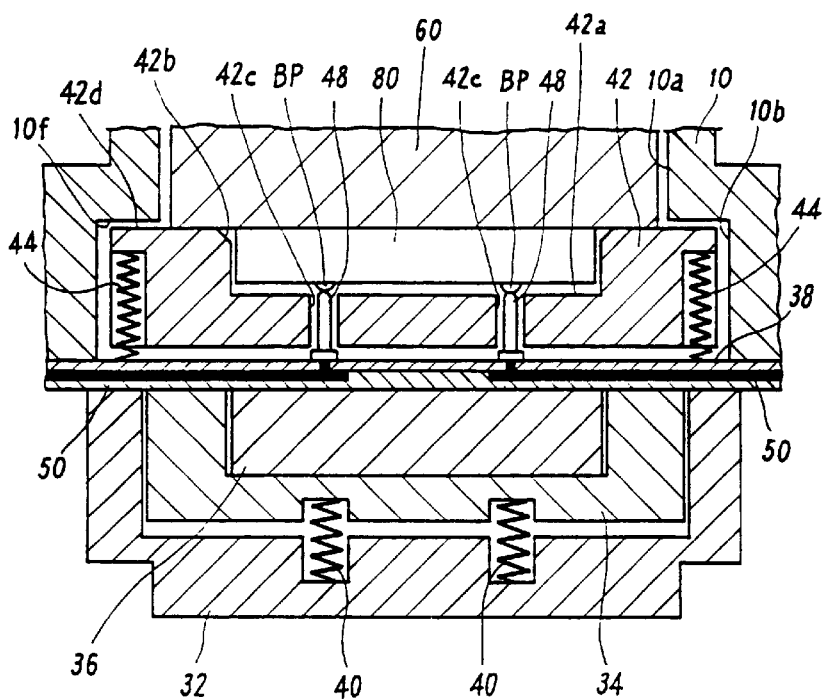
FIG. 6 is a partial cross-sectional view showing the construction of an essential part of the cover as well as the main socket body of FIG. 1 at the time when the bare chip has been loaded in the socket.

In FIG. 5, the cavity 42a of the positioning plate 42 is empty and no force is applied to the insulating film 38 when no bare chip 80 has been loaded. In this state, the periphery portion 42d of the upper surface of the positioning plate 42 is in contact with the step part (step part between the inner wall 10a at the top and the intermediate inner wall 10b) 10f of the external base 10. In addition, the tip of each needle-shaped contact 48 is at a location inside each through hole 42c or at a location which is lower than the bottom of cavity 42a.

When bare chip 80 is inserted into the cavity 42a of the positioning plate 42 by means such as a pair of tweezers, the bare chip is guided by the tapered guide surface 42b on the periphery of the cavity 42a and is positioned inside the cavity 42a. Since at this time the tip of a needle-shaped contact 48 is not protruding into the bottom of the cavity 42, the bare chip is smoothly positioned. Inside the cavity 42a, each bump BP of the bare chip 80 corresponds to the tip of each corresponding needle-shaped contact 48 through each corresponding through hole 42c. In this example, the upper surface of the bare chip 80 inside the cavity 42a is located at a lower position than the upper surface of peripheral part 42d of positioning plate 42.

When the cover 12 is closed and the latch 24 is secured as is shown in FIG. 2, the holding pad 60 of the cover 12 is received into the upper chamber of the external base 10. Initially the holding pad 60 contacts the periphery of the upper surface of the positioning plate 42 and then moves downward with the positioning plate 42 in opposition to the compressive coil springs 44. During this downward movement of positioning plate 42, holding pad 60 also engages the upper surface of the bare chip 80 which moves downward also with holding pad 60 and positioning plate 42.

When the positioning plate 42 moves downward in this manner, each needle-shaped contact 48 rises relative to each through hole 42c and its contact tip touches each corresponding bump BP from below. In view of the fact that the bare chip 80 is also pressed down by the holding pad 60, the needle-shaped contact 48 receives a compressive force from the bump BP side. This compressive force to the needle-shaped contact 48 is provided by compressive coil springs 40 through insulating film 38, upper support plate 36 and the intermediate support plate 34.

Each needle-shaped contact 48 is then connected to each corresponding socket contact 56 through each corresponding electroconductive film 50. Because of this, each bump BP is connected to a prescribed pad on the printed substrate 70 through each corresponding needle-shaped contact 48, wiring electroconductive film 50 and socket contact 56, finally being electrically connected to an inspection device (which is not shown in the drawing) through printed wiring on the printed substrate 70.

In this way, bare chip 80 receives a prescribed test such as a burn-in test in the state of being loaded on this socket. During the course of the burn-in test, the heat that is generated from the bare chip 80 is quickly absorbed by holding member 60 with its heat sink means and with heat discharging fins 60b.

For the removal of the bare chip 80 from the socket, the latch 24 is released, the cover 12 is opened and the bare chip 80 is removed by such means as a pair of tweezers from the cavity 42a of positioning plate 42.

In the socket of this embodiment which as been described above, a plurality of through holes 42c which correspond in a one-to-one relationship to the bumps BP of the bare chip 80 are arranged on the bottom of cavity 42a of the positioning plate 42, that positions and carries the bare chip 80. Additionally, a plurality of wiring electroconductive films 50 corresponding in a one-to-one relationship to the bumps BP are pattern-formed on the insulating film 52 that has been arranged under the positioning plate 42 and a plurality of needle-shaped contacts 48 corresponding in a one-to-one relationship to the wiring electroconductive films 50 are erected on the insulating films 52 in such a fashion that each may be movably positioned in the axial direction into each corresponding through hole 42c. The insulating film 52 is elastically supported in such a way as to effect displacement in the vertical direction as compared with the inner base 32 by means of the compressive coil springs 40 through the upper support plate 36 and the intermediate support place 34, and the positioning plate 42 is elastically supported in such a manner as to be vertically movable as compared with the inner base 32 from the compressive coil springs 44.

The following advantages are provided by the socket of this inventions:

(1) Since each bump BP of the bare chip 80 and each needle-shaped contact 48 are mutually accurately positioned through the positioning plate 42, a reliable electric contact is obtained between the two. In view of the fact that the space occupied by each needle-shaped contact 48 is small and a high-density arrangement is possible, the socket can easily deal with an increase in the number of pins and a narrowing of the pitches of the bumps BP.

(2) As a result of the shape of the needle-shaped contacts 48, when they contact the lower surface of bumps BP, they contact and break the oxide film on the surface thereby providing a satisfactory electric connection irrespective of the shape (even in the case of cavities, for example) and the size of the bumps BP.

(3) The compressive coil springs 44 provide sufficient dimensional tolerance to assure reliable and uniform electrical contacting between the chip bumps and socket contacts.

(4) The press-down member 60 that presses down on bare chip 80 from above is made from a heat sink material. It can effectively discharge the heat from the bare chip 80 thereby protecting the chip.

Figure 7:
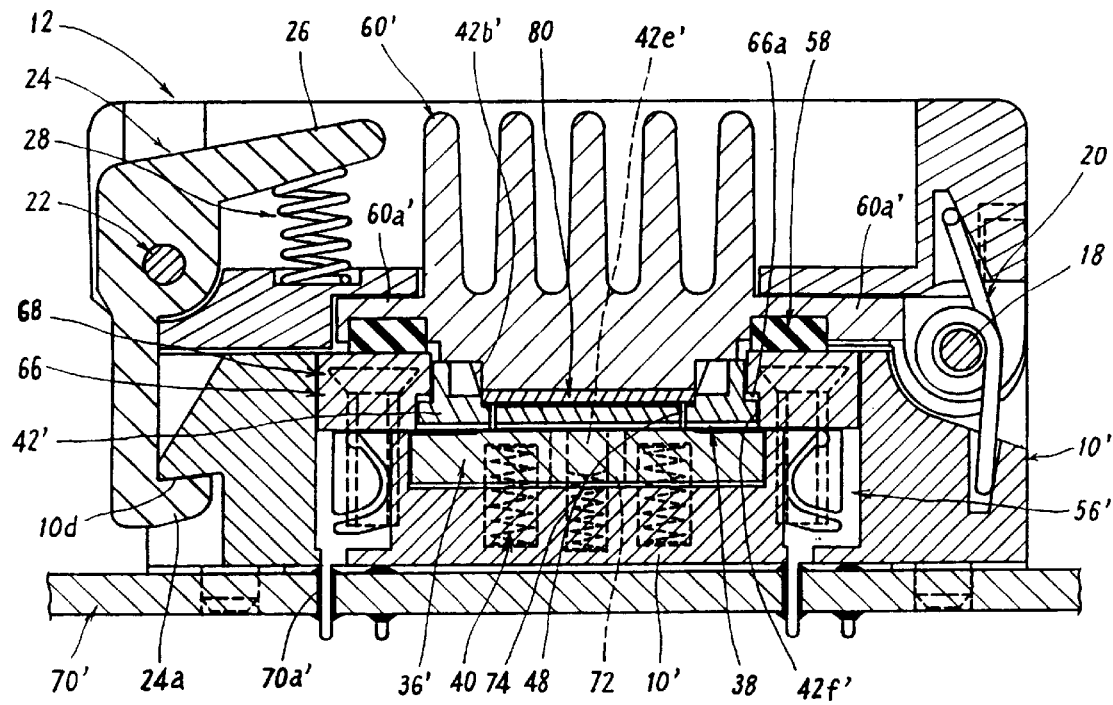
FIG. 7 is a cross-sectional view showing a socket of a second embodiment of the present invention in which a bare chip is loaded in the socket.
Figure 8:
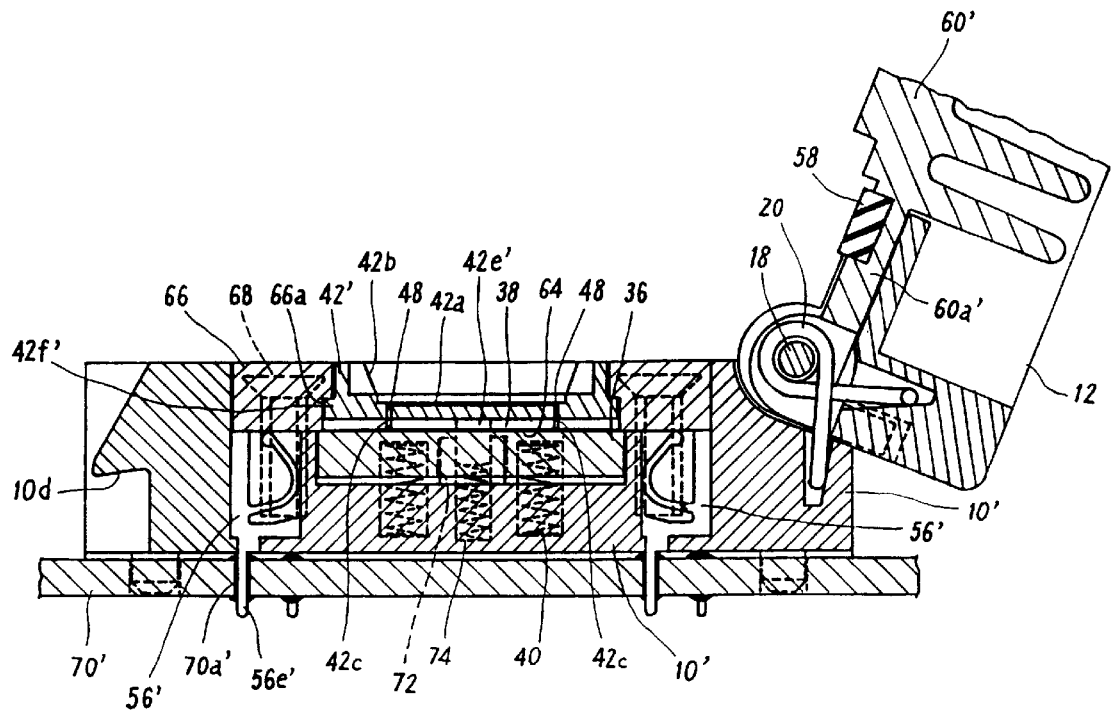
FIG. 8 is a cross-sectional view of FIG. 7 when the cover is open and no bare chip is loaded in the socket.

A second embodiment of the present invention is a variation of the first embodiment which will be explained below by referring to FIGS. 7 and 8. Similar reference numerals have been used to describe the same part in each embodiment. FIG. 7 is a cross-sectional view of the construction of the socket when an electric part is loaded on this socket. FIG. 8 is a cross-section showing the construction of a main socket body at the time when the cover is opened.

In this second embodiment, the upper support plate 36 and the intermediate support plate 34 of the first embodiment are made into one single support plate 36' of either a metal or a ceramic material with a compliant rubber sheet 64 having a suitable thickness and hardness being provided between this support plate 36' and the insulating film 38 (see FIG. 8).

This rubber sheet 64 serves the function of compensating for the dimensional variations in the length of needle-shaped contacts 48, and for making uniform the contact pressure between each bump BP of the bare chip 80 and each needle-shaped contact 48 when the die is mounted in the socket.

Additionally, base 10' in this second embodiment has a construction which is equivalent to the outside and inner bases 10 and 32 in the first embodiment integrated into one part. A frame-shaped holding plate 66 is arranged in the cavity of the base 10' on the insulating film 38 and a positioning plate '42 is arranged inside this frame-shaped holding plate 66. The holding plate is removably installed on the base 10' by a screw 68.

The positioning plate 42' has a support shaft 42e' that extends vertically downward from lower surface of plate 42' as shown in FIG. 8. The support shaft 42e' is freely inserted into a tubular body 72 which is movably contained in a support plate 36' through the insulating film 38 and an opening of the rubber sheet 64, and is elastically supported by the compressive coil spring 74 in such a manner to be movable vertically in relation to base 10'.

A flange part 42f is formed on the outer peripheral portion of the positioning plate 42' and when the cover 12 is open, the engagement of this flange part 42f with a step part 66a on the inner wall surface (see FIG. 8) of the holding plate 66 determines the upper position (original position) of the positioning plate 42'.

A lower connecting part 56e' of the socket contact 56' is inserted into and connected to a through hole 70a' of a printed substrate 70'. A holding pad member 60' serving as a heat sink is installed on and fixed to the cover 12 by means of a gland part 60a' that extends to the back of the dust seal 58. It is also to be understood that cover 12 and holding pad member 60' (or 60) may be formed as an integral part.

The operating of this second embodiment is the same as described above for the first embodiment.

In these two embodiments which have been described above, the pattern of the bump arrangement on the bare chip is merely an example. The socket of these embodiments will work with a bump arrangement having different patterns such as a matrix shape or the like. The member that elastically supports the insulating film 38 and the positioning plate 42 (42') are not limited to compressive coil springs 40 and 44 (74) but they can be constructed with other elastic members such as plate springs, etc.

The shape and size of the needle-shaped contact 48 can also be shaped in various ways. For example, a contact 48 can be curved. Even the connection between the needle-shaped contact 48 and the insulating film 38 and the electroconductive film 50 for wiring can be varied as is shown in FIGS. 9a, 9b and 9c.

Figure 9A:
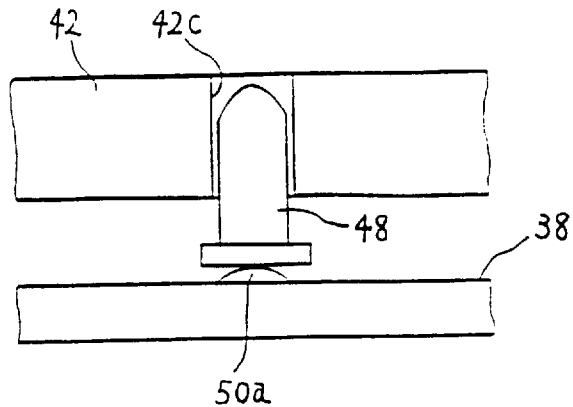
FIGS. 9a, 9b and 9c are partial cross-sectional views showing various connections between a needle-shaped contact and a wiring electroconductive film of this invention.

FIG. 9a shows the placing of the lower surface of needle-shaped contact 48 on the protrusion of the electroconductive film 50. The connected part can be re-enforced by soldering.

Figure 9B:
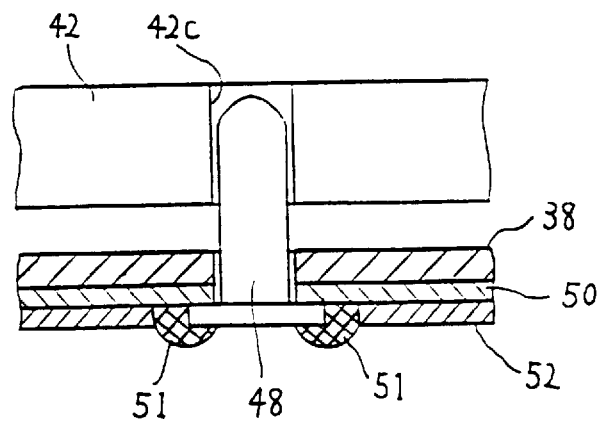

FIG. 9b shows the case where the needle-shaped contact 48 is passed into the through hole of the insulating film 38 and the lower portion of the needle-shaped contact 48 is connected to the wiring electroconductive film 50 by means of soldering 51 on the back of the film 38.

Figure 9C:
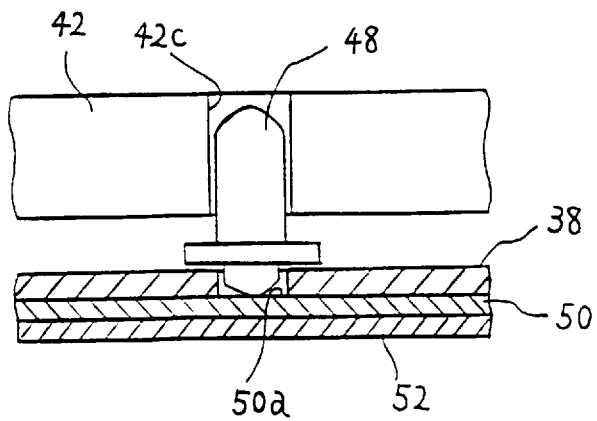
Figure 10:
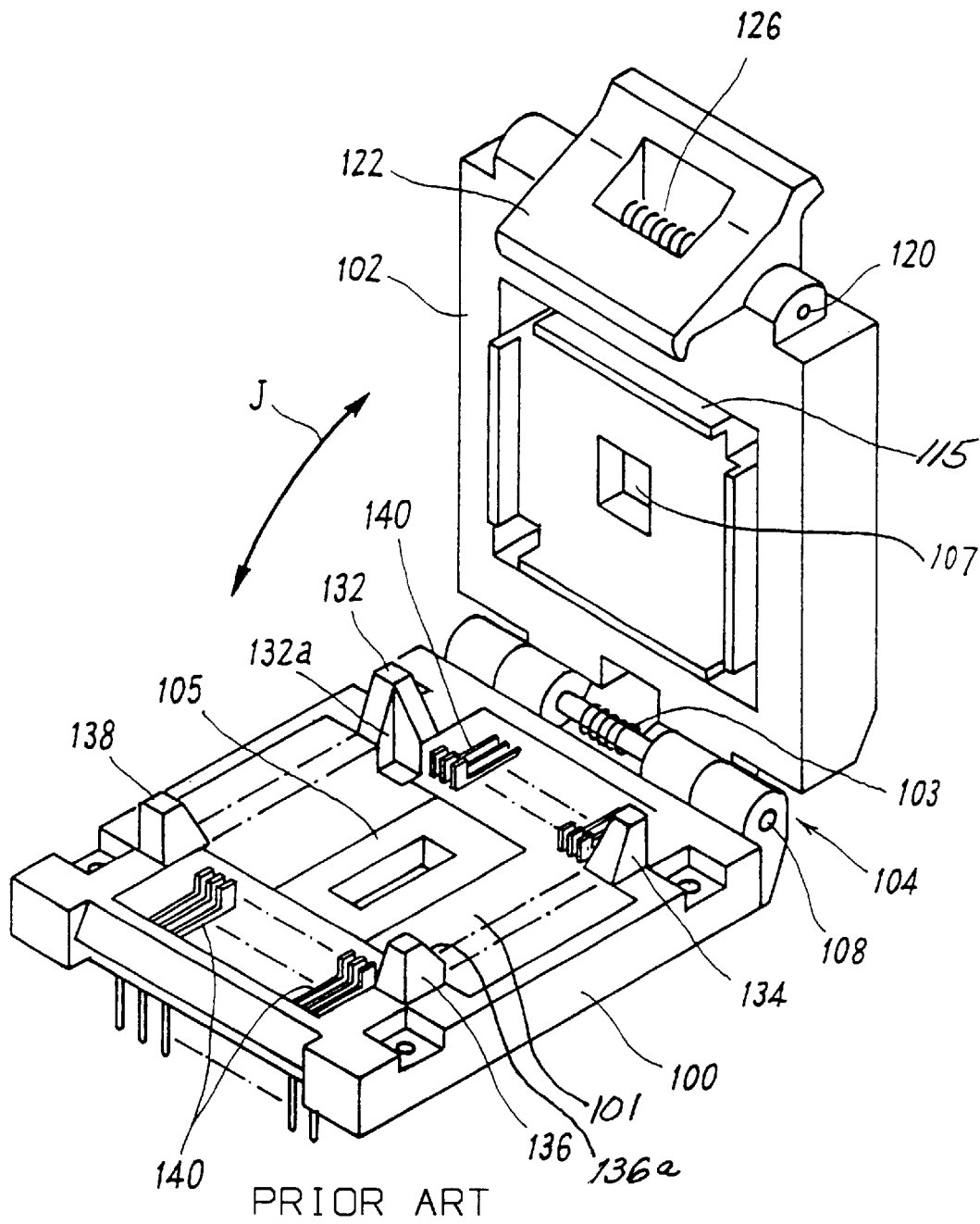
FIG. 10 is an oblique view of a prior art socket.
Figure 11:
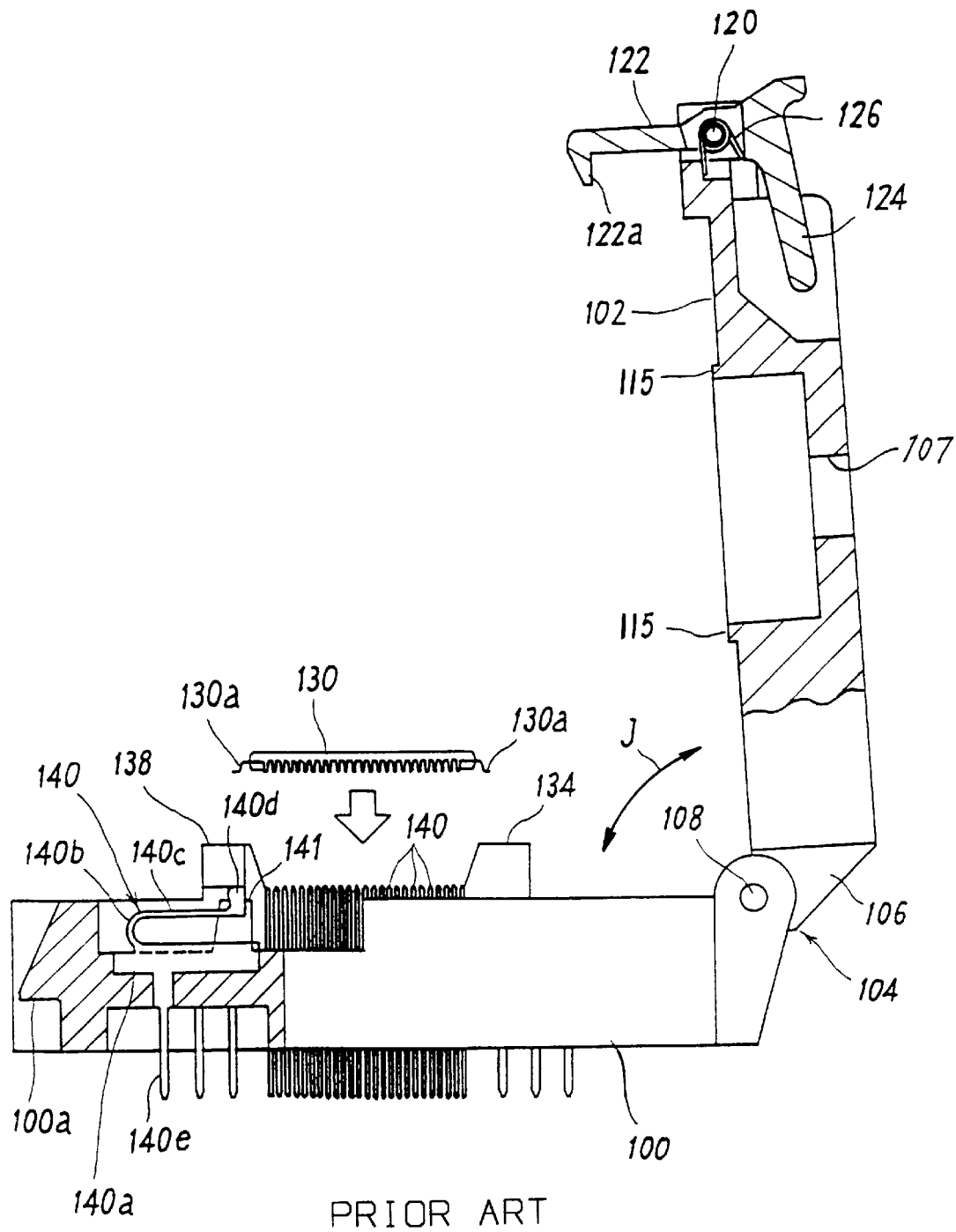
FIG. 11 is a cross-sectional view of the socket of FIG. 10.

FIG. 9c shows the case where connection part 50a of the electroconductive film 50 is exposed and this is placed on the lower surface of the needle-shaped contact 48 for connection.

This invention has been explained with reference to the embodiments stated above. It should be pointed out that said embodiments can be modified further on the basis of the technical concepts of this invention. For example, the shape of positioning plate 42 (42') and the construction of the placing surface and the guiding part can be varied in conformity with the shape of the electrical part to be mounted. Moreover, the socket of the present invention can be used not only for a bare chip but also for an electrical part that does not have an external lead terminal.

I claim:

1. A socket comprising a main socket body for receiving an electrical part with a plurality of connective terminals, a positioning plate contained in said main socket body which has an upper placing surface on which said electric part is positioned and placed, said positioning plate having a plurality of through holes corresponding in a one-to-one relationship to the plurality of connective terminals of said electrical part to be placed on said placing surface, an insulating film positioned within said socket body adjacent a lower surface of said positioning plate opposite said upper placing surface, said insulating film having a plurality of electroconductive films contained on a surface of said insulating film with said electroconductive films corresponding in a one-to-one relationship to said plurality of through holes, a first support member movably contained within said main socket body for resiliently supporting said insulating film, a plurality of contact makers which are movably contained in said through holes for providing electrical connection between said plurality of connective terminals and said plurality of electroconductive films, and a plurality of socket contacts contained in said main socket body adapted to be electrically connected to a means external to said socket body which are electrically connected in a one-to-one relationship with said plurality of electroconductive films thereby providing for electrical connection between said electrical part and said means external to said socket body.

2. The socket according to claim 1 wherein said electrical part is a bare chip with no external lead terminals.

3. The socket according to claim 1 wherein each of the plurality of contact makers is needle shaped and has a lower portion that is in direct contact at all times with one of the plurality of electroconductive films.

4. The socket according to claim 1 further including a cover mounted on said main socket body so as to be freely movable between an open and a closed position.

5. The socket according to claim 4 wherein said cover includes a holding means for securely holding said electrical part on said placing surface when said cover is in said closed position.

6. The socket according to claim 5 wherein said holding means is a heat sink for carrying heat away from said electrical part.

7. The socket according to claim 1 further including a second support member contained within said main socket body for resiliently supporting said positioning plate.

8. A socket comprising a main socket body for receiving a bare die with a plurality of connective terminals and no external lead terminals, a positioning plate contained in said main socket body which has an upper placing surface on which said bare die is positioned and placed, said positioning plate having a plurality of through holes passing through the positioning plate between the upper placing surface and a lower surface corresponding in a one-to-one relationship at the upper placing surface to the plurality of connective terminals of said bare die to be placed on said placing surface, an insulating film positioned within said socket body adjacent said lower surface of said positioning plate, said insulating film having a plurality of electroconductive films contained on a surface of said insulating film with said electroconductive films corresponding in a one-to-one relationship to said plurality of through holes at the lower surface of the positioning plate, a first movable support member including spring means for resiliently supporting said insulating film within said main socket body, a plurality of contact makers which are movably contained in said through holes for providing one-to-one electrical connection between said plurality of connective terminals and said plurality of electroconductive films, and a plurality of socket contacts contained in said main socket body adapted to be electrically connected to a means external to said socket body which are electrically connected to a one-to-one relationship with said plurality of electroconductive films thereby providing for electrical connection between said bare die and said means external to said socket body.

9. The socket according to claim 8 wherein each of the plurality of contact makers is needle shaped and has a lower portion that is in direct contact at all times with one of the plurality of electroconductive films.

10. The socket according to claim 8 further including a cover mounted on said main socket body so as to be freely movable between an open and a closed position.

11. The socket according to claim 10 wherein said cover includes a holding means for securely holding said bare die part on said placing surface when said cover is in said closed position.

12. A socket according to claim 11 wherein said holding means is a heat sink for carrying heat away from said electrical part.

13. The socket according to claim 8 further including a second support member including spring means for movably supporting said positioning plate in a generally horizontal state within said main socket body.

14. A socket according to claim 8 further including a second insulating film generally covering said plurality of electroconducive films.

* * * * *